(12) United States Patent
Vernooy et al.

(10) Patent No.: US 8,588,558 B2
(45) Date of Patent: Nov. 19, 2013

(54) OPTICAL LINK CIRCUIT AND METHOD OF MAKING SAME

(75) Inventors: David William Vernooy, Niskayuna, NY (US); Samhita Dasgupta, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1114 days.

(21) Appl. No.: 12/329,183

(22) Filed: Dec. 5, 2008

(65) Prior Publication Data

US 2010/0142881 A1    Jun. 10, 2010

(51) Int. Cl.
*G02B 6/12* (2006.01)

(52) U.S. Cl.
USPC .......................................................... 385/14

(58) Field of Classification Search
USPC .......................................................... 385/14
See application file for complete search history.

(56) References Cited

U.S. PATENT DOCUMENTS

| | | | |
|---|---|---|---|
| 2003/0039455 A1* | 2/2003 | Ouchi | 385/88 |
| 2005/0014421 A1* | 1/2005 | Sweetland | 439/775 |
| 2005/0201693 A1* | 9/2005 | Korenaga et al. | 385/89 |
| 2007/0086696 A1* | 4/2007 | Hsu | 385/14 |
| 2009/0208164 A1* | 8/2009 | Kim et al. | 385/14 |

OTHER PUBLICATIONS

Ahn et al., "Pluggable Optical Board Interconnection System With Flexible Polymeric Waveguides," IEEE Photonics Technology Letters, vol. 20, No. 8, Apr. 15, 2008, pp. 572-574.
Hendrickx et al., "Tolerance Analysis for Multilayer Optical Interconnections Integrated on a Printed Circuit Board," Journal of Lightwave Technology, vol. 25, No. 9, Sep. 2007, pp. 2395-2401.
Hwang et al., "Two-Dimensional Optical Interconnection Based on Two-Layered Optical Printed Circuit Board," IEEE Photonics Technology Letters, vol. 19, No. 6, Mar. 15, 2007, pp. 411-413.
Van Geffen et al., "Optical Links in Handheld Multimedia Devices," Photonics in Multimedia II, Proc. of SPIE, vol. 7001, 2008.
Voutilainen et al., "Future Mobile Device Interconnections," IEEE Workshop SPI, 2007.

* cited by examiner

*Primary Examiner* — Uyen Chau N Le
*Assistant Examiner* — Hoang Tran
(74) *Attorney, Agent, or Firm* — Ziolkowski Patent Solutions Group, SC; Jean K. Testa

(57) ABSTRACT

A circuit includes a flexible circuit having an optical waveguide embedded therein, a first device attached to the flexible circuit and configured to convert a first electrical signal to an optical signal, the first device positioned to emit the optical signal to an input end of the optical waveguide, and a second device attached to the flexible circuit and configured to convert the optical signal into a second electrical signal, the second device positioned to receive the optical signal from an output end of the optical waveguide.

26 Claims, 2 Drawing Sheets

OPTICAL LINK CIRCUIT AND METHOD OF MAKING SAME

BACKGROUND OF THE INVENTION

The invention relates generally to optical circuits and, more particularly, to a method and apparatus for conveying optical signals in a flexible package.

In recent years, processor speeds have increased while electronics packages have decreased in size. The increased processor speeds and decreased package size have enabled tremendous increases in digital data rate capabilities, thus enabling miniaturization of high-speed digital devices such as cell phones, camcorders, laptop and desktop computers, and digital televisions, as examples. In addition, because of the tighter space requirements and miniaturization, the processors and components are typically fabricated on small printed circuit boards or multi-layer flexible circuits. In a cell phone application, for instance, the components may be placed on a multiple layer flexible circuit so that a hinge may be formed between two halves of the circuit, thus enabling the cell phone to be opened and closed using the flexible nature of the circuit at the hinge, while enabling components to be placed on a single circuit.

In order to convey these tremendous rates of digital data in affordable and manufacturable devices, different solutions have been applied in the industry that include electronics-only and optical configurations that are typically mounted on a flex circuit or a board having a multi-layer flexible circuit therebetween. For instance, in an electronics-only solution, multiple parallel paths may be built into a multi-layer flexible circuit that enable high rates of digital data to be conveyed simultaneously and in parallel. As the number of parallel paths increases, so too does the capability for high-speed data transmission. However, such configurations also may increase the propensity for cross-talk and electromagnetic interference (EMI) in the parallel portions of the circuit. One option includes an electrical micro-coax, which becomes lossy, expensive and less flexible as frequency increases. Further, as the number of parallel paths increases, circuit cost and complexity increase as well. Thus, in such solutions, though circuits may meet the data rate needs, a trade off may be made in terms of manufacturing cost and yield, as well as performance and signal interference due to the parallel data transmissions.

Solutions using optical components may decrease the propensity for cross-talk, because optical signals typically do not emit EMI, nor are the optical components typically subject to EMI interference from other electrical components. The solutions that include optical devices typically include optical connectors with driving electronics on a main board or multiple separate optical transceiver modules. In such configurations, although the amount of cross-talk may be decreased when compared to an electronics-only solution, such configurations may find limited application because of the additional power requirements and space/packaging requirements for driving electronics or transceivers. In addition, such configurations typically may not be tested in the fabrication process until a final assembly is complete. For instance, in a cell phone application, when installing optical components, the optical links may not be tested or testable until the cell phone is at or near its final stage of manufacture. Thus, failure of a component may not be uncovered until late in the manufacturing process, resulting in costly trouble-shooting and re-work, or costly disposal of the entire device, including the transmitting and receiving components thereof.

Therefore, it would be desirable to design an apparatus and method providing increased data rate capabilities in digital electronics devices, while decreasing package size, power requirements, cross-talk, and overall manufacturing costs.

BRIEF DESCRIPTION OF THE INVENTION

The invention is an apparatus for conveying communication signals and a method of making same.

According to one aspect of the invention, a circuit includes a flexible circuit having an optical waveguide embedded therein, a first device attached to the flexible circuit and configured to convert a first electrical signal to an optical signal, the first device positioned to emit the optical signal to an input end of the optical waveguide, and a second device attached to the flexible circuit and configured to convert the optical signal into a second electrical signal, the second device positioned to receive the optical signal from an output end of the optical waveguide.

According to another aspect of the invention, a method of fabricating a circuit includes enclosing a first material in a second material, the first material having an index of refraction greater than the second material, the first material having an input end and an output end, attaching a photon emitter to the second material such that an output of the photon emitter is optically coupled to the input end of the first material, and attaching a photon receiver to the second material such that an input of the photon receiver is coupled to the output end of the first material.

In accordance with yet another aspect of the invention, a communication link is configured to convey signals at the speed of light, the communication link includes an optical waveguide buried within a polymer, the optical waveguide having an input end and an output end, a first device attached to the communication link and coupled to the input end of the optical waveguide, the first device configured to emit photons into the optical waveguide, and a second device attached to the communication link, the second device coupled to the output end of the optical waveguide and configured to convert photons emitted into the optical waveguide into an electrical signal.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION

Embodiments of the invention are described with respect to cell phones and cell phone technology. However, one skilled in the art will recognize that embodiments of the invention are equally applicable to other electronics devices having high speed digital signals conveyed between components.

Figure 1:
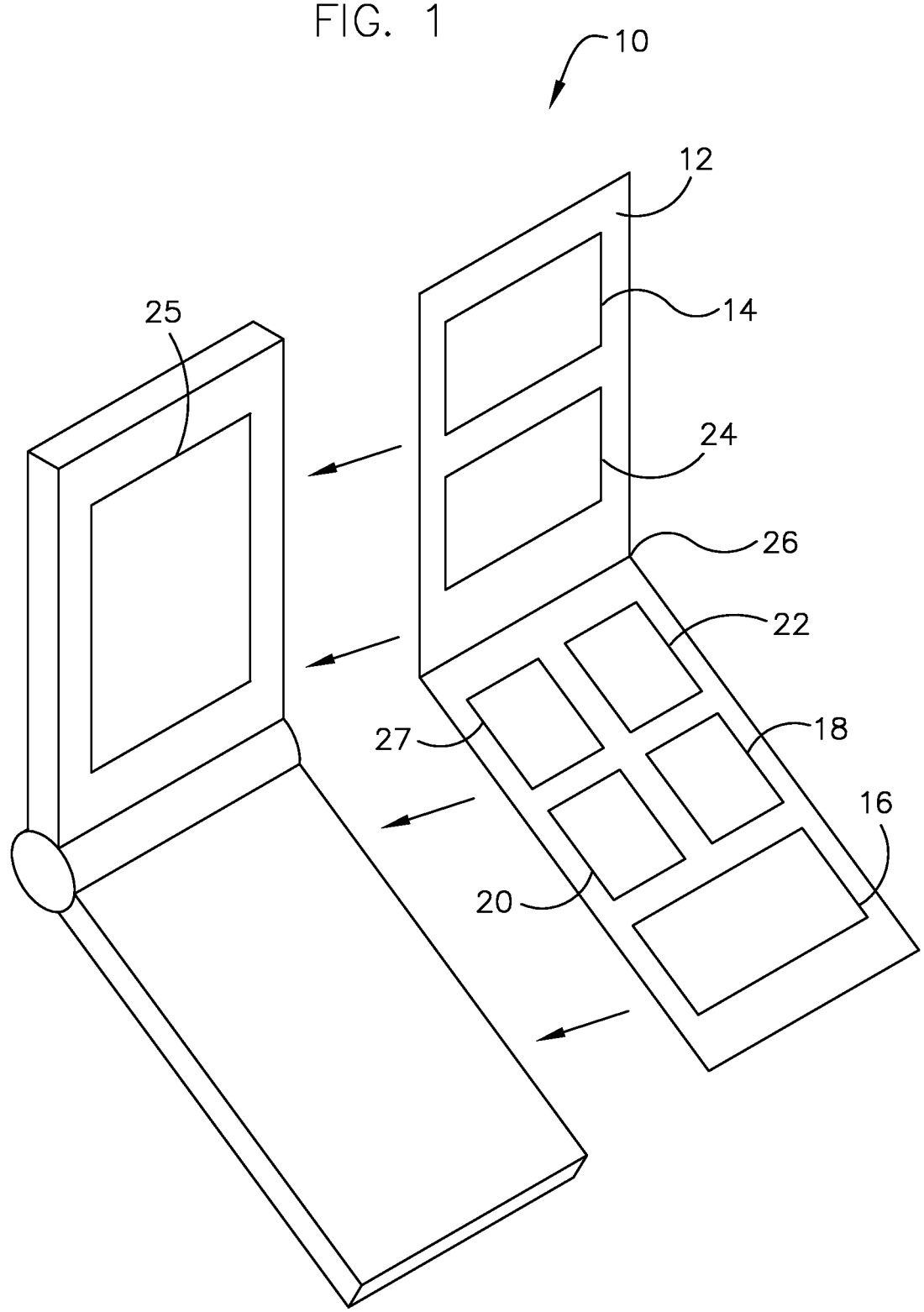
FIG. 1 illustrates a cell phone having a circuit therein according to an embodiment of the invention.

FIG. 1 illustrates a cell phone 10 incorporating embodiments of the invention. Cell phone 10 illustrates some of the basic components of a cell phone in order to illustrate aspects of the invention. Cell phone 10 includes a circuit 12 having an RF transmitter and receiver amplifier 14 positioned thereon. Circuit 12 includes a Digital Signal Processor, or DSP 16, and an audio digital/analog and analog/digital converter 18. Circuit 12 further includes a memory chip 20, microprocessor and control logic 22, and radio frequency (RF) amplifiers and power 24. In operation, RF transmitter and receiver amplifier 14 typically receives and transmits high-speed digital signals to and from, for instance, cell towers. The high-speed signals received therefrom are typically emitted or conveyed within circuit 12 to other components thereon, such as, for instance, audio digital/analog and analog/digital converter 18. Cell phone 10 may include a display 25 and circuit 12 may include a video processor 27 separate from display 25. Thus, signals at rates of, for instance, 1 Gb/sec or more, may be conveyed within the cell phone 10 during operation. Because video signals typically travel within circuit 12 (which typically includes parallel transmission of signals), between the video processor 27 and the display 25 of cell phone 10, the signals sent therein tend to be noisy and may be corrupted due to interference during the parallel transmission, which tends to corrupt the performance of the RF transmitter and receiver amplifier 14. Thus, because optical signals do not typically emit EMI, and losses in optical components tend to be negligible, an optical circuit may be included in the circuit according to embodiments of the invention.

Because some cell phones are configured to open and close, they may include a hinge 26 having, for instance, a 5 mm bend radius through which electrical signals may pass during use. The hinge 26 typically is designed to bend and straighten many hundreds of thousands of times during life of the cell phone. Further, although circuits illustrated herein, in the following figures, show optical components passing through hinge 26, one skilled in the art will recognize that the optical circuits illustrated may instead pass signals from front to back of the circuit (i.e. wrap around), or may be incorporated in a cell phone having a different (i.e. non-hinged) arrangement, thus benefitting from incorporation of optical components as described.

Figure 2:
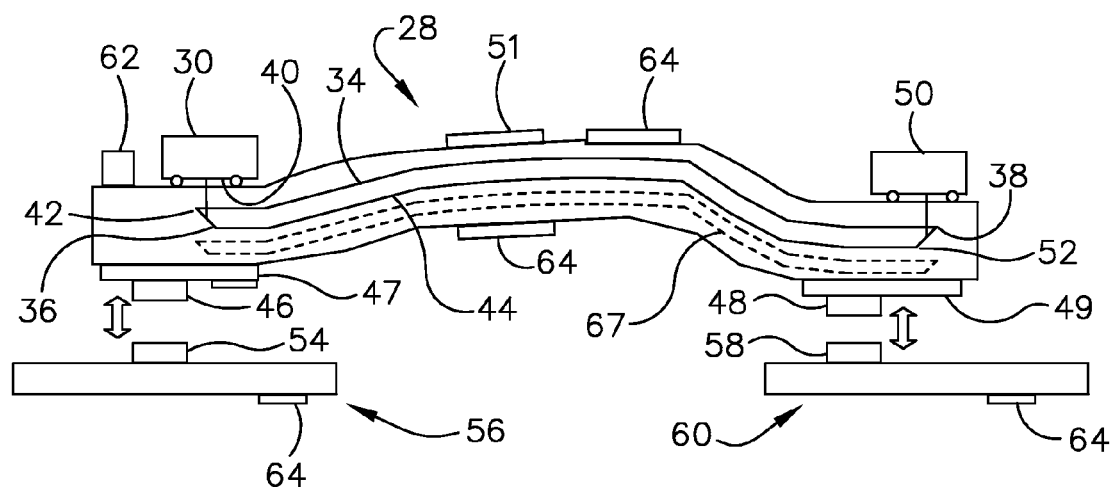
FIG. 2 illustrates a flexible circuit having reflectors therein according to an embodiment of the invention.

FIG. 2 illustrates a digital communication link or circuit 28 according to an embodiment of the invention. Circuit 28 includes a device 30 such as an emitter or a vertical cavity surface-emitting laser (VCSEL) positioned on a multi-layer flexible circuit 32. In embodiments of the invention, flexible circuit 32 comprises conductive electrical layers separated by polymers of multiple layers (not shown) and having vias therein. In one embodiment the polymer is Kapton® (Kapton® is a registered trademark of Du Pont De Nemours and Company Corporation of Delaware). In another embodiment, flexible circuit may be configured to provide RF shielding functionality, or may include features to enhance conductive heat transfer therein. For instance, components may be attached thereto using a liquid crystal polymer (LCP) to provide RF shielding or using filled epoxies having increased thermal conductivity (e.g. using fillers such as silver, diamond, aluminum nitride, and the like) or heat spreaders may be attached thereto to enhance thermal conduction therein. In some cases, these functions (RF shielding, heat sinking, mechanical stiffening, performing optical reflections) may be performed by portions of elements already present, such as the electrical connector or backing board elements. Additionally, master alignment features or fiducials may be attached or affixed thereto to facilitate assembly of components, such as an embedded optical waveguide 34, as will be discussed further, to flexible circuit 32.

Flexible circuit 32 includes a buried or embedded optical waveguide 34 configured to convey optical signals between a first point 36 and a second point 38 of flexible circuit 32. In embodiments of the invention, optical waveguide 34 comprises a core layer of polyimide/epoxy, acrylic/epoxy, polysulfone/epoxy, or polycarbonate/epoxy, and the like, that is laminated with polyimide and adhesive layers, such as flexible circuit 32. In such embodiments, the epoxy component of optical waveguide 34 may be a UV-sensitive material, thus enabling the index of refraction to be UV-sensitive. Thus, an inexpensive material may be fabricated simply into a bulk material and providing waveguide properties thereto.

According to one embodiment of the invention, embedded optical waveguide 34 comprises a core material such as a polymer surrounded by a cladding material (not shown) and then flexible circuit 32. Materials are chosen such that the permittivity (dielectric constant), or refractive index, of the core of embedded optical waveguide 34 is larger than that of the surrounding material, such as the cladding material or flexible circuit 32, thus electromagnetic energy or optical signals therein are confined largely to embedded optical waveguide 34 through the phenomenon of total reflection at a boundary 44 between the two dielectrics.

As discussed, in embodiments of the invention, the core of optical waveguide 34 typically has an index of refraction higher than the material surrounding it. Thus, in an embodiment that includes a cladding material, the core typically has a higher index of refraction than the cladding. In one embodiment of the invention, the cladding material comprises a metal which can provide low loss waveguiding, albeit for a single polarization. In another embodiment, the cladding material comprises a UV-sensitive epoxy adhered to a core or center material that, when exposed to UV, forms a waveguide material. In yet another embodiment, an adhesive or a polymer (i.e. a polyimide such as Kapton®) may be applied to an outer surface of the core material.

In an alternate embodiment, the cladding material is thick enough to isolate the core material from the surroundings so light won't leak from the core to the surrounding materials. In such an embodiment, optical signals are conveyed and isolated therein because of the cladding material thickness.

Thus, in the embodiments described, the material having the highest index of refraction typically serves as the optical waveguide material according to embodiments of the invention. As such, by forming a waveguide having a high index of refraction that is bordered, or surrounded, by materials having a lower index of refraction, the waveguide may thus operate to convey optical signals according to embodiments of the invention. Further, although specific embodiments are described for fabrication of embedded optical waveguide 34, the invention described herein is not so limited. Thus, one skilled in the art will recognize that embedded optical waveguide 34 may be formed or fabricated by other means, and that the invention described herein is equally applicable to embodiments wherein embedded optical waveguide 34 provides optical waveguide properties wherein optical signals may be conveyed therein while being isolated from surrounding materials.

First point 36 of embedded optical waveguide 34 is optically coupled to an optical output 40 of device 30 via a first reflector 42 such as a turning mirror. Circuit 28 includes a device 50 such as a photodiode receiver positioned thereon and optically coupled to second point 38 of flexible circuit 32. Circuit 28 includes a second reflector 52 such as a turning mirror positioned at second point 38, according to an embodiment of the invention. The turning mirrors 42, 52 are designed and positioned such that electromagnetic or optical signals may be transferred to and from their respective components 30, 50. First turning mirror 42 includes a surface having an approximate 45° angle such that optical signals that emit from device 30 impinge the first turning mirror 42 and are reflected into embedded optical waveguide 34. Second turning mirror 52 likewise includes a surface having an approximate 45° angle such that optical signals passing through embedded optical waveguide 34 are reflected therefrom and into device 50. In embodiments of the invention, turning mirrors 42, 52 are fabricated, as examples, via angled etching or "grey scale" lithography, via drilling and ablation, via a diamond saw with a shaped blade, or via an additional component attached thereto having the preferred angle. Circuit 28 may be attached, via a first connector 46, to a connector 54 of a first printed circuit board 56 and, via a second connector 48, to a connector 58 of a second printed circuit board 60.

In embodiments of the invention, a length of embedded optical waveguide 34 is approximately 10 cm. However, one skilled in the art will recognize that, because signal loss is negligible in optical transmission lines as compared electrical transmission lines, the length of embedded optical waveguide 34 may be substantially greater than 10 cm. Materials and waveguide geometry are also chosen such that a bend radius of 5 mm or less is obtainable to serve as a hinge, such as hinge 26 of FIG. 1.

Circuit 28 includes first connector 46 and second connector 48. First connector 46 is electrically coupled to device 30 and second connector 48 is electrically coupled to device 50. In embodiments of the invention, first and second connectors 46, 48 are positioned on respective stiffening sections or backer boards 47, 49, located on both ends where devices 30, 50 are located. First backer board 47 and second backer board 49 comprise a rigid PCB material, FR-4, and the like. Backer boards 47, 49 thus provide mechanical rigidity near devices 30, 50, as well as connectors 46, 48. Backer boards 47, 49 may likewise provide a material for sinking heat generated within circuit 28, as well as providing a surface or material for adding robustness during assembly, handling, and testing.

Although first and second connectors 46 and 48 are illustrated on a side (e.g. the top side, as illustrated in FIG. 2) of circuit 28 that is opposite a side that devices 30 and 50 are positioned, one skilled in the art will recognize that connectors 46, 48 and respective backer boards 47,49 may be positioned on the same side of circuit 28. In other words, each connector 46, 48 may be positioned on the same side of circuit 28 as devices 30, 50. Further, one skilled in the art will recognize that connectors 46 and 48 may be placed on opposite sides (e.g. one on top and one on bottom) of circuit 28, and as an example connector 46 may be positioned on the same side of the circuit as device 30, while connector 48 may be positioned on the opposite side of circuit 50. Such alternate placement of connectors 46, 48 may be selected for ease of access or to facilitate routing of electrical and optical lines through flexible circuit 32. Connectors 46, 48 may be snap-down or push-down type connectors, or may be edge-connectors (as in a USB connector). In an embodiment where one or both connectors 46, 48 are edge-connectors, connectors 46, 48 may be incorporated into backer boards 47, 49 and backer boards may function as the connector.

Circuit 28 may include one or more test pads 51 positioned on flexible circuit 32. According to this embodiment, test pads 51 are exposed on an outer surface to enable and facilitate fast testing for a tester interface during manufacturing and assembly. And, although test pads 51 are illustrated on flexible circuit 32 at a central location roughly centered between device 30 and device 50, one skilled in the art will recognize that test pads 51 may be positioned at any location or at multiple locations on flexible circuit 32 to enable testing of components and features of circuit 28 during assembly. In embodiments of the invention, test pads 51 are placed at one or both ends of circuit 28, and in such an embodiment, test pads 51 may be incorporated into backer boards 47, 49 to take advantage of the mechanical integrity provided therefrom.

In operation, electrical signals may be conveyed from first printed circuit board 56 to second printed circuit board 60 via circuit 28 according to embodiments of the invention. Electrical signals may be conveyed through connector components 54, 46 to device 30 via electrical traces (not shown). Device 30 is configured to convert the electrical signals into optical signals and to convey the optical signals to first turning mirror 42 at first point 36. The optical signals pass along embedded optical waveguide 34, reflect off of second turning mirror 52 at second point 38, and impinge device 50, where the optical signals are converted back into electrical signals. The electrical signals emitting from device 50 are conveyed to connector components 48, 58 via electrical traces (not shown) and to second printed circuit board 60. Thus, because optical signals are not a source of EMI, such a configuration may operate having reduced EMI when compared to a circuit having conventional electrical circuitry therein. In embodiments of the invention, electrical connector pairs 46/54 and 48/58 are of the "low profile, snap-in" type. Connector pairs 46/54 and 48/58 may also have other functionality such as mechanical stiffening, alignment features, electrical shielding & even integrating of the turning mirror. Also, pairs 46/54 and 48/58 may be surface mount compatible for high volume manufacturing.

In one embodiment, circuit 28 includes additional interfacing electronics 64 such as a driver amplifier 62 configured to receive the electrical signals from first printed circuit board 56. In other embodiments, interfacing electronics 64 comprising resistors, capacitors, integrated circuits such as driver and low noise receiver amplifiers, and the like may be positioned on flexible circuit 32 and or on one or both of the printed circuit boards 56, 60. As such, driver amplifier 62 may have added functionality such as the ability to temporarily store signals during operation and then send the signals to device 30 in a "burst" mode, thus sending data at very high rates, such as 1 Gb/s or more, and reducing an overall duty cycle. Such operation enables overall reduction in power consumption and dissipation in circuit 28. Further, circuit 28 is also scalable to higher speeds because of the high bandwidths the optical link can support compared to an electronic link. Furthermore, the use of a reduced duty cycle burst mode with higher bandwidths during the burst, the link may be operated having a reduced power consumption over an electronic solution which would not support this mode. In one embodiment, driver amplifier 62 is eliminated from circuit 28 and device 30 and/or 50 are driven directly from the logic levels available at an output of the DSP 16, as illustrated in FIG. 1.

Because of the connectors 46/54 and 48/58, circuit 28 supports high-volume manufacturing and may reduce overall product manufacturing costs because of the ability to test circuit 28 separately from other electrical components on, for instance, first printed circuit board 56 and second printed circuit board 60. As an example, printed circuit boards 56, 60 may include components of a cell phone and, as such, circuit 28 may be tested during the manufacturing process and discarded or re-worked if found to have faulty components therein, thus avoiding unnecessary disposal of more costly components that reside on printed circuit boards 56, 60. And, in a cell phone application, because of the flexible nature of flexible circuit 32 and the ability of embedded optical waveguide 34 to convey optical signals therethrough, circuit 28 may provide a hinge capability to the cell phone at a point, such as hinge 26 as illustrated in FIG. 1.

In addition, although a uni-directional embodiment is illustrated above, one skilled in the art will recognize that circuit 28 may instead include a bidirectional capability. In other words, although the embodiment of FIG. 2 is illustrated as having device 30 configured to receive electrical signals and emit optical signals, and as having device 50 configured to receive optical signals and emit electrical signals, components 30, 50 may instead include bi-directional components. As such, circuit 28 may instead be configured to both send electrical signals from first printed circuit board 56 to second printed circuit board 60, and vice versa, via embedded optical waveguide 34. In one embodiment, bi-directional capability for circuit 28 is provided via an LED that is configured to both transmit and receive light. In another embodiment, bi-directional capability is provided using a second parallel waveguide 67 (illustrated in phantom) on the same flex circuit, rather than sending signals bi-directionally down/up the same waveguide. Such an embodiment may include, as an example, two lasers and two photodiodes, each on opposite ends of the links, thus enabling optical signals to be sent simultaneously in each direction.

Thus, in applications having electrical signals conveyed bi-directionally, circuit 28 may likewise support such an application by enabling optical signals to be sent and received therethrough, in burst mode, and in a testable configuration that improves performance, reduces cross-talk, and reduces manufacturing costs thereof. In other words, device 30 may be configured to receive electrical signals at an input and output photons to, for instance, embedded optical waveguide 34, and may likewise receive photons from embedded optical waveguide 34 and convert the photons to an electrical signal. Likewise, device 50 may be configured to receive optical signals from, for instance, embedded optical waveguide 34, and output electrical signals therefrom, and likewise may receive electrical signals and output an optical signal to embedded optical waveguide 34.

Figure 3:
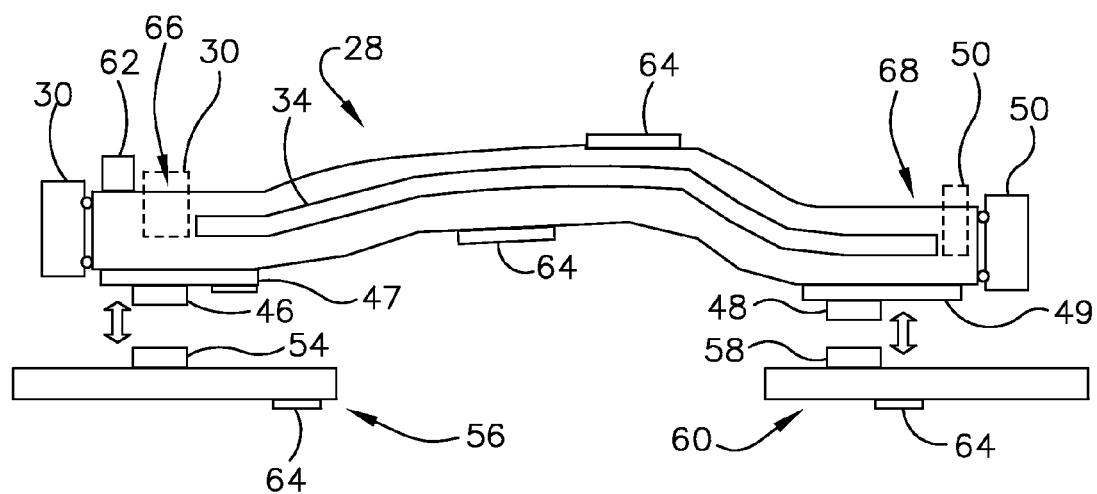
FIG. 3 illustrates a flexible circuit having components mounted on the ends according to an embodiment of the invention.

FIG. 3 illustrates circuit 28 according to another embodiment of the invention. Circuit 28 includes connector pairs 46/54 and 48/58 coupled respectively to device 30 and device 50, with connectors 46 and 48 positioned on respective backer boards 47, 49. However, in this embodiment, device 30 and device 50 are positioned respectively on a first end 66 and a second end 68 of circuit 28. In this embodiment, in order to accommodate the relatively thin material of flexible circuit 32, Devices 30, 50 are LEDs capable of being affixed to first and second ends 66, 68 of circuit 28. Thus, optical signals emitting to/from components 30, 50 do so directly into embedded optical waveguide 34 without bending through first turning mirror 42 and second turning mirror 52 as illustrated in FIG. 2. In one embodiment of the invention, device 30, device 50, driver amplifier 62, and interfacing electronics 64 are buried within flexible circuit 32 and electrically and optically connected therein. In another embodiment, device 30 is an edge-emitting laser and device 50 is an edge-on receiving photodiode (both illustrated in phantom at respective first and second ends 66, 68).

In operation, electrical signals may be conveyed from first printed circuit board 56 to second printed circuit board 60 via circuit 28 according to embodiments of the invention. Thus, electrical signals may be conveyed through connector components 54, 46 to device 30. Device 30 converts electrical signals to optical signals and conveys the optical signals to directly into embedded optical waveguide 34, and optical signals emit therefrom and directly impinge device 50 where the optical signals are converted to an electrical signal. The electrical signals emitting therefrom are conveyed to connector components 48, 58 and to second printed circuit board 60.

Further, one skilled in the art will recognize that the embodiments described with respect to that illustrated in FIG. 2 are equally applicable to that illustrated in FIG. 3. Thus, in the embodiments presented herein, because circuit 28 is capable of high-speed transmission of optical signals, circuit 28 is well-suited to take advantage of high-speed serial communication protocols (such as USB, E-SATA, Infiniband, PCI Express, MIDI, Ethernet, Serial RapidIO, and the like). Additionally, because the MIPI D-PHY and M-PHY protocols, and the like, are dedicated mobile processor interfaces that include serialization and de-serialization for moving data between a processor and a display, circuit 28 is thus suitable and applicable to cell phone 10 as illustrated in FIG. 1, as an example. Such a circuit may move data between, as examples, video processor 27 and the display 25 of cell phone 10 illustrated in FIG. 1, in either a serial optical lane or in an alternate embodiment having just a few parallel lanes.

Thus, according to an embodiment of the invention, a circuit includes a flexible circuit having an optical waveguide embedded therein, a first device attached to the flexible circuit and configured to convert a first electrical signal to an optical signal, the first device positioned to emit the optical signal to an input end of the optical waveguide, and a second device attached to the flexible circuit and configured to convert the optical signal into a second electrical signal, the second device positioned to receive the optical signal from an output end of the optical waveguide.

According to another embodiment of the invention, a method of fabricating a circuit includes enclosing a first material in a second material, the first material having an index of refraction greater than the second material, the first material having an input end and an output end, attaching a photon emitter to the second material such that an output of the photon emitter is optically coupled to the input end of the first material, and attaching a photon receiver to the second material such that an input of the photon receiver is coupled to the output end of the first material.

In accordance with yet another embodiment of the invention, a communication link is configured to convey signals at the speed of light, the communication link includes an optical waveguide buried within a polymer, the optical waveguide having an input end and an output end, a first device attached to the communication link and coupled to the input end of the optical waveguide, the first device configured to emit photons into the optical waveguide, and a second device attached to the communication link, the second device coupled to the output end of the optical waveguide and configured to convert photons emitted into the optical waveguide into an electrical signal.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit for a cell phone comprising:
   a flexible circuit having an optical waveguide embedded therein;

a video processor coupled to a first device via a first printed circuit board, the video processor configured to output a first electrical signal to the first device, the first device attached to the flexible circuit and configured to convert the first electrical signal to an optical signal, the first device positioned to emit the optical signal to an input end of the optical waveguide, wherein the flexible circuit is coupled to the first printed circuit board via a first connector at the input end of the optical waveguide;

a second device attached to the flexible circuit and configured to convert the optical signal into a second electrical signal, the second device positioned to receive the optical signal from an output end of the optical waveguide, wherein the flexible circuit is coupled to a second printed circuit board, via a second connector, at an output end of the optical waveguide;

a video display coupled to the second device and configured to receive the second electrical signal; and a test pad positioned on the flexible circuit separate from the first connector and the second connector, the test pad configured as a tester interface to test the flexible circuit during manufacturing separate from using the first connector and the second connector.

2. The circuit of claim 1 further comprising an optical reflector configured to reflect optical signals between the optical waveguide and one of the first device and the second device.

3. The circuit of claim 1 wherein the first device is a vertical cavity surface emitting laser (VCSEL).

4. The circuit of claim 1 wherein the first and second devices are bi-directional components, each configured to convert electrical signals to optical signals, and to convert optical signals to electrical signals.

5. The circuit of claim 4 wherein one of the first and second devices comprises an LED configured to send and receive optical signals.

6. A method of fabricating a cell phone circuit comprising:
enclosing a first material in a second material, the first material having an index of refraction greater than the second material, the first material having an input end and an output end;
attaching a photon emitter to the second material such that an output of the photon emitter is optically coupled to the input end of the first material;
attaching a photon receiver to the second material such that an input of the photon receiver is coupled to the output end of the first material;
attaching a first connector to the cell phone circuit and electrically coupling the first connector to the photon emitter, wherein the first connector is connectable to a first printed circuit board;
attaching a second connector to the cell phone circuit and electrically coupling the second connector to the photon receiver, wherein the second connector is connectable to a second printed circuit board;
coupling interfacing electronics to one of the photon emitter and the photon receiver; and
attaching a test pad to the cell phone circuit and testing the interfacing electronics via the test pad prior to connecting the first connector to the first printed circuit board and prior to connecting the second connector to the second printed circuit board.

7. The method of claim 6 wherein the second material comprises a polyimide.

8. The method of claim 6 further comprising attaching a first reflector to the first material at the input end to reflect photons into the first material that emit from the photon emitter and attaching a second reflector to the first material at the output end to reflect photons into the photon receiver that pass through the first material.

9. A communication link configured to convey signals at the speed of light, the communication link comprising:
an optical waveguide buried within a polymer, the optical waveguide having an input end and an output end;
a first device attached to the communication link and coupled to the input end of the optical waveguide via a first connector at the input end of the optical waveguide, the first device configured to emit photons into the optical waveguide;
a second device attached to the communication link, the second device coupled to the output end of the optical waveguide via a second connector at the output end of the optical waveguide and configured to convert photons emitted into the optical waveguide into an electrical signal;
a driver amplifier attached to the communication link, the driver amplifier having an output coupled to the first device such that electrical signals from the driver amplifier are converted to photons and conveyed along the optical waveguide; and
a test pad positioned on the communication link separate from the first connector and the second connector, the test pad configured as a tester interface to test the communication link during manufacturing separate from using the first connector and the second connector;
wherein the driver amplifier is configured to temporarily store electrical signals during operation and send the electrical signals to the first device in a burst mode.

10. The communication link of claim 9 wherein the optical waveguide comprises one of a polyimide, an acrylic, a polysulfone, and a polycarbonate.

11. The communication link of claim 9 wherein the first and second devices comprise bi-directional conversion devices, each configured to convert photons into an electrical signal, and each configured to convert an electrical signal in photons.

12. The communication link of claim 9 wherein the first device is a surface-emitting laser.

13. The communication link of claim 9 wherein the second device is a photodiode receiver.

14. The communication link of claim 9 wherein the optical waveguide has an index of refraction greater than the polymer.

15. The communication link of claim 9 further comprising a connector attached to the communication link, the connector electrically coupled to one of the surface-emitting laser and the photodiode receiver.

16. The communication link of claim 9 further comprising a first reflector attached to the communication link and optically coupled between the surface-emitting laser and the input end of the optical waveguide, and a second reflector attached to the communication link and optically coupled between the photodiode receiver and the output end of the optical waveguide.

17. The circuit of claim 1 wherein the circuit is affixable to the cell phone such that the flexible circuit forms a bendable hinge, such that the video processor is positioned within the circuit on one side of the bendable hinge and the video display is on the other side of the bendable hinge such that the optical signal passing from the video processor to the video display passes through the bendable hinge.

18. The circuit of claim 1 wherein the video processor is configured to output the first electrical signal as a digital signal at a rate that is greater than 1 Gb/sec.

19. The circuit of claim 1 comprising a driver amplifier configured to receive electrical signals from the first printed circuit board such that signals are temporarily stored during operation and then sent to the first device in a burst mode as a digital signal that is greater than 1 Gb/s.

20. The method of claim 6 comprising:
attaching a video processor to the first printed circuit board;
attaching a video display to the second printed circuit board;
coupling an output of the video processor to an input of the photon emitter; and
coupling an input of the video display to an output of the photon receiver;
wherein electrical signals from the video processor are converted to optical signals in the photon emitter, passed along the first material as an optical signal and through a bendable hinge of the cell phone, converted to electrical signals in the photon receiver, and displayed in the video display.

21. The method of claim 6 comprising:
attaching a driver amplifier to the cell phone circuit;
coupling the driver amplifier to an input of the photon emitter; and
configuring the driver amplifier such that signals are temporarily stored during operation and then sent in burst mode as electrical signals to the photon emitter, greater than a digital rate of 1 Gb/s, through the first material as an optical signal.

22. The communication link of claim 9 wherein the burst mode at a rate that is greater than 1 Gbs.

23. The communication link of claim 9 comprising:
a video processor attached to the communication link, the video processor configured to output an electrical signal to the first device; and
a video display attached to the communication link and configured to receive electrical signals from the second device;
wherein the communications link includes a bendable hinge of a cell phone positioned such that the emitted photons pass through the bendable hinge.

24. The circuit of claim 1 wherein the first device and the second device are positioned on respective input and output ends of the flexible circuit such that:
the optical signal emitted from the first device to the input end of the optical waveguide pass into the optical waveguide without passing through a reflective mirror; and
the optical signal received at the second device and at the output end of the optical waveguide pass into the second device without passing through a reflective mirror.

25. The circuit of claim 6 wherein the photon emitter is an edge-emitting laser that is optically coupled to the input end of the first material such that optical signals passing therebetween to the first material do not bend through a turning reflective mirror, and wherein the photon receiver is an edge-on receiving photodiode that is optically coupled to the output end of the first material such that optical signals passing therebetween do not bend through a turning reflective mirror.

26. The communication link of claim 9 wherein the first device is attached to the communication line such that the emitted photons do not bend through a turning mirror before received by input end of the optical waveguide, and wherein the second device is attached to the communication link such that the photons converted into the electrical signal do not bend through a turning mirror before passing to the second device.

* * * * *